United States Patent [19]

Hayashi

[11] Patent Number: 5,403,818

[45] Date of Patent: Apr. 4, 1995

[54] CERAMIC SUPERCONDUCTOR AND METHOD OF PREPARING THE SAME

[75] Inventor: Kazuhiko Hayashi, Osaka, Japan

[73] Assignee: Engineering Research Association For Superconductive Generation Equipment and Materials, Osaka, Japan

[21] Appl. No.: 33,989

[22] Filed: Mar. 19, 1993

Related U.S. Application Data

[63] Continuation of Ser. No. 701,397, May 16, 1991, abandoned.

[30] Foreign Application Priority Data

May 16, 1990 [JP] Japan .................. 2-127569

[51] Int. Cl.$^6$ ..................... H01B 12/06; H01L 39/12; H01L 39/02
[52] U.S. Cl. ..................... 505/451; 505/733; 505/740; 505/430; 505/450; 505/474; 117/904
[58] Field of Search ............... 505/733, 740, 430, 450, 505/451; 117/904

[56] References Cited

U.S. PATENT DOCUMENTS

5,070,071 12/1991 Gaballe et al. .................. 505/1

FOREIGN PATENT DOCUMENTS

0390016 10/1990 European Pat. Off. .

OTHER PUBLICATIONS

Gazit et al, "Laser-Heated Pedestal Growth of High Tc Bi-Sr Ca-Cu-O Superconductor Fibers", 1988 Jour. Crystal Growth 91 no month.
Gazit et al, "Growth of Bi Based Superconducting Ribbons", 1989 Jour. Xtal Growth 90 no month.
Kurosaka et al, "Superconducting Bi-Sr-Ca-Cu-O Crystalline Fiber Prepared by the Micro Cyochnaldi Method", 1989, no month.
Levinson et al, "Laser Zone-Melt Bi-Sr-Ca-Cu-O Thick Film", Appl Phy Lett, 55 (16), 16 Oct. 1989, pp. 1683-1685.
D. Gazit et al. "Influence of growth rate on the structure and composition of float grown $Bi_2Sr_2CaCu_2O_8$ superconducting fibers Journal of Crystal Growth" vol. 98, No. 3, Nov. 1989, Amsterdam NL pp. 545-549.
K. Tachikawa et al. "Potential methods for the fabrication of high-Tc superconductors for wires and cables". Proceedings of the IEEE vol. 77, No. 8, Aug. 1989, New York US pp. 1124-1130.
A. Kurosaka et al. "Superconducting Bi-Sr-Ca-Cu-O cyrstallize fibers prepared by the micro-Czochalski method" Applied Physics Letters vol. 55, No. 4, 24 Jul. 1989.
D. Gazit et al. "Growth of Bi-based superconducting ribbons" Journal of Crystal Growth vol. 98, No. 3, Nov. 1989, Amsterdam NL pp. 541-544.
D. Gazit et al. "Laser-Heated pedestal growth of high Tc Bi-Sr-Ca-Cu-O superconducting fibers" Journal of Crystal Growth vol. 91, 1988, Amsterdam NL pp. 318-330 no month.

*Primary Examiner*—Mark L. Bell
*Assistant Examiner*—C. M. Bonner
*Attorney, Agent, or Firm*—Pennie & Edmonds

[57] ABSTRACT

A Bi—Sr—Ca—Cu—O ceramic superconductor contains 0112 phases which are finely dispersed in a 2212-phase matrix with its c-axis oriented perpendicular to a growth direction.

A method of preparing a Bi—Sr—Ca—Cu—O ceramic superconductor comprises the steps of growing crystals under conditions satisfying:

$$G/R \geq 1 \text{ and } G.R \geq 10000$$

where G (K/cm) represents the temperature gradient at a solid-liquid interface and R (mm/h) represents the rate of crystal growth, and annealing the grown crystals in an atmosphere having oxygen partial pressure of at least 0.05 atm. within a temperature-range of 800° to 860° C. for at least 2 hours.

2 Claims, 2 Drawing Sheets

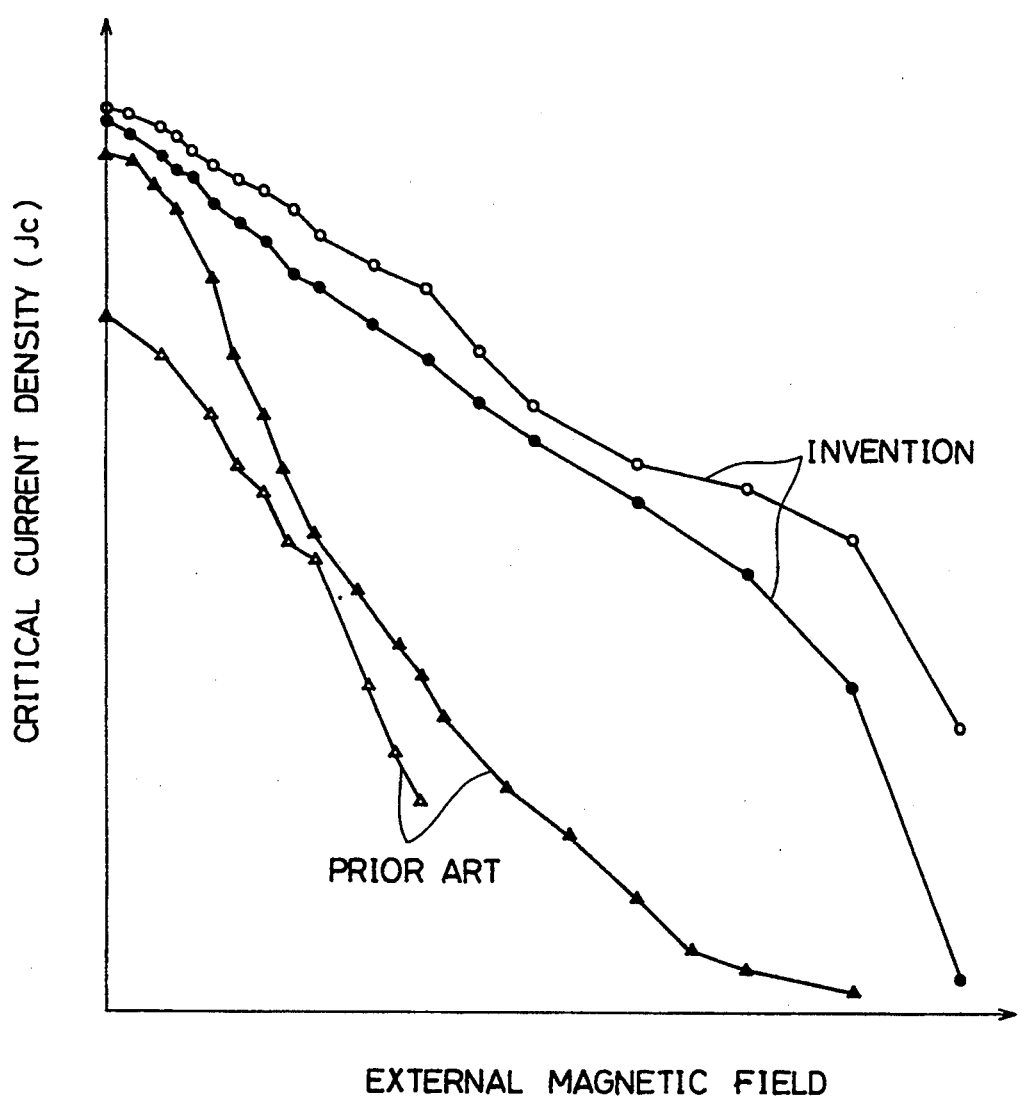

CERAMIC SUPERCONDUCTOR AND METHOD OF PREPARING THE SAME

This is a continuation of application Ser. No. 07/701,397, filed May 16, 1991, now abandoned.

BACKGROUND OF THE INVENTION

1. Field of the Invention

The present invention relates to a superconductor of a ceramic superconductive material and a method of preparing the same.

2. Description of the Background Art

Ceramic superconductive materials have been recently watched with interest as materials which exhibit high critical temperatures. In order to obtain a superconductor having a desired configuration from such a ceramic superconductive material, a sintering method of press-molding a raw material of ceramic powder and thereafter sintering the same is generally employed.

However, in such a sintering method, it is difficult to obtain a dense superconductor because of voids resulting from compression molding of the powder material, and hence improvement of superconducting properties is restricted.

Reports by R. S. Feigelson et al., SCIENCE vol. 240, Jun. 17 1988, pp. 1642 1645 and by G. F. de la Fuente et al., MRS SPRING MEETING, April 1989 each disclose a method of preparing a superconductor such as a Bi—Sr—Ca—Cu—O ceramic superconductor or a Bi—Pb—Sr—Ca—Cu—O superconductor in the form of fiber by a laser pedestal growth method.

However, in the conventional method of preparing a Bi—Sr—CaCu—O ceramic superconductor using the laser pedestal growth method, the growth rate must be reduced in order to align superconducting phases. Thus, this method is has inferior productivity in terms of application to a wire or the like. Further, although a Bi—Sr—Ca—Cu—O ceramic superconductor obtained according to the conventional method attains a high critical current density ($J_c$) in a zero magnetic field, the critical current density is reduced in a magnetic field. Such a phenomenon causes a significant problem in application to a magnet or the like, which is used in a magnetic field.

SUMMARY OF THE INVENTION

An object of the present invention is to provide a ceramic superconductor, which exhibits a high critical current density even in a magnetic field, and a method of preparing the same.

A Bi—Sr—Ca—Cu—O ceramic superconductor according to the present invention is characterized in that 0112 phases having a composition of Bi:Sr:Ca:Cu=0:1:1:2, i.e., the so-called Bi deficient phases, are finely dispersed in a 2212-phase matrix having a composition of Bi:Sr:Ca:Cu=2:2:1:2, of which c-axis is oriented perpendicular to a growth direction.

The 2212-phase matrix preferably has heterogeneous composition distribution around the 0112 phases.

The method according to the present invention is adapted to prepare a Bi—Sr—Ca—Cu—O ceramic superconductor by the laser pedestal growth method, and characterized in that crystals are grown under conditions satisfying:

$$G/R \geq 1 \text{ and } G \cdot R \geq 10000$$

where G (K/cm) represents the temperature gradient at a solid-liquid interface and R (mm/h) represents the rate of crystal growth, and the grown crystals are annealed in an atmosphere having oxygen partial pressure of at least 0.05 atm. within a temperature-range of 800° to 860° C., for at least 2 hours.

The crystal structure of a Bi—Sr—Ca—Cu—O ceramic superconductor, i.e., the low-temperature superconducting phase of a bismuth based superconductor, has a strong two-dimensionality, and its superconducting properties such as the critical current density are strongly anisotropic due to crystal orientation. Therefore, a high critical current density cannot be obtained unless the crystals are oriented in order along the a-b plane, for example. However, even if a high critical current density is attained by such orientation of the crystals, the low-temperature superconducting phase of the bismuth based superconductor has inferior force of pinning penetrating flux lines as compared with a yttrium based superconductor etc., and its critical current density is significantly reduced in a magnetic field.

The inventive ceramic superconductor has a crystal structure such that 0112 phases are finely dispersed in a 2212-phase matrix with its c-axis oriented perpendicular to a growth direction and such that its critical current density is less reduced in a magnetic field.

A Bi—Sr—Ca—Cu—O ceramic superconductor having such a crystal structure can be obtained by growing crystals in a laser pedestal growth method under conditions satisfying:

$$G/R \geq 1 \text{ and } G \cdot R \geq 10000$$

where G (K/cm) represents the temperature gradient at a solid-liquid interface and R (mm/h) represents the rate of crystal growth, and annealing the grown crystals in an atmosphere having oxygen partial pressure of at least 0.05 atm. within a temperature range of 800° to 860° C. for at least 2 hours.

FIG. 1 is a longitudinal sectional view showing an unannealed state of crystals which are grown according to the inventive method. Referring to FIG. 1, Bi deficient phases 1, which are 0112 phases, are oriented in the growth direction, and other decomposition product phases 2 exist around the Bi deficient phases 1. The Bi deficient phases 1 contain smaller amounts of Bi, while the other decomposition product phases 2 contain larger amounts of Bi in return.

FIG. 2 is a longitudinal sectional view showing an annealed state of the crystals which are grown according to the inventive method. The crystals shown in FIG. 1 are annealed under the aforementioned conditions, to attain the crystal structure shown in FIG. 2. 2212 phases 3, which are low-temperature superconducting phases, are grown in the growth direction, while 0112 phases 4, which are residual Bi deficient phases, are finely dispersed in the 2212 phases 3. The 2212 phases 3 are formed by reaction between the Bi deficient phases 1 and the other decomposition product phases 2 shown in FIG. 1. While complete 2212 phases are formed at the interfaces between the Bi deficient phases 1 and the other decomposition product phases 2, those formed in central portions of the Bi deficient phases 1 away from the interfaces have incomplete compositions. Therefore, the 2212 phases 3 contain smaller amounts of Bi in the vicinity of the 0112 phases and larger amounts of Bi around the peripheries of the 2212 phases. Thus, the 2212-phase matrix has heterogeneous composition distribution in the crystal structure of the superconductor prepared according to the inventive method. Such heterogeneous composition distribution is generally called "compositional fluctuation" of 2212 phases. It seems that the inventive superconductor exhibits a high critical current density in a magnetic field since the finely dispersed residual 0112 phases and the composition fluctuation serve as pinning centers for the aforementioned flux lines. Further, since the 2212-phase matrix is oriented in the growth direction, the superconductor readily carries current as a whole and exhibits a high critical current density in a zero magnetic field, while the critical current density is not much reduced but remains at a high level in a magnetic field.

FIG. 3 shows critical current densities of crystals, which are grown according to the inventive method, measured in magnetic fields. Even if external magnetic fields are increased, the inventive superconductors exhibit higher critical current densities as compared with conventional superconductors which are in crystal states solidified and oriented directly from molten states, as shown in FIG. 3.

Unannealed crystals prepared according to the inventive method are characterized in that Bi deficient phases are oriented in the growth direction. It is possible to obtain a superconductor whose superconducting phases are oriented in a fine crystal structure by annealing such crystals with the Bi deficient phases being oriented in the growth direction. It has been found that orientation of decomposition product phases other than the Bi deficient phases is not of much importance in the unannealed crystal structure but excellent orientation of the superconducting phases can be attained so far as the Bi deficient phases are oriented.

In order to orient the Bi deficient phases, i.e., 0112 phases in the unannealed state, i.e., the as-grown state, the ratio G/R of the temperature gradient G to the growth rate R must be increased. Namely, it is possible to orient the Bi deficient phases by increasing the ratio G/R. In order to obtain the Bi deficient phases as fine structures, further, the product G·R of the temperature gradient G and the growth rate R must be increased, so that a sufficient cooling rate is ensured to obtain the Bi deficient phases as finely oriented structures.

If the ratio G/R is less than 1, it is impossible to attain orientation of the Bi deficient phases, or crystal growth itself is disabled. If the product G·R is less than 10000, on the other hand, it is difficult to finely disperse the Bi deficient phases, which are formed as coarse structures.

The crystals grown with fine orientation of the Bi deficient phases are annealed under the aforementioned conditions, in order to obtain a superconductor which comprises a low-temperature superconducting phase matrix, i.e., a 2212-phase matrix, and Bi deficient phases, i.e., 0112 phases finely dispersed in the matrix. As to the annealing conditions, the oxygen partial pressure is set to be at least 0.05 atm. since the amount of oxygen contained in the low-temperature superconducting phases is reduced and a sufficient critical temperature ($T_c$) cannot be obtained if the oxygen partial pressure is less than 0.05 atm. The annealing temperature is set in a range of 800° to 860° C. since formation of the low-temperature superconducting phases will not sufficiently progress if the annealing temperature is less than 800° C., while the crystals are remelted and absolutely changed in structure if the annealing temperature exceeds 860° C. The annealing is performed for at least 2 hours since formation of the low-temperature superconducting phases will not sufficiently progress if the annealing time is less than 2 hours.

The superconductor according to the present invention exhibits a high critical current density, which is not much reduced but remains at a high level even in a magnetic field. Therefore, the inventive superconductor can be employed as a wire which is available in a magnetic field, so that the same can be applied to a magnet which is drivable in liquid nitrogen.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 illustrates critical current densities of crystals, which are grown according to the inventive method, measured in magnetic fields.

DESCRIPTION OF THE PREFERRED EMBODIMENTS

Example 1

Figure 1:
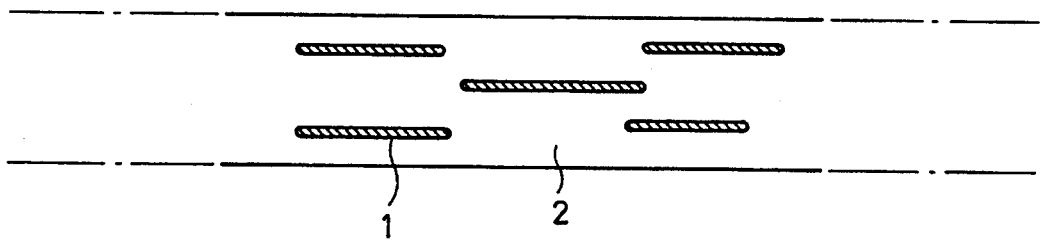
FIG. 1 is a longitudinal sectional view showing an unannealed state of crystals which are grown according to the inventive method.
Figure 2:
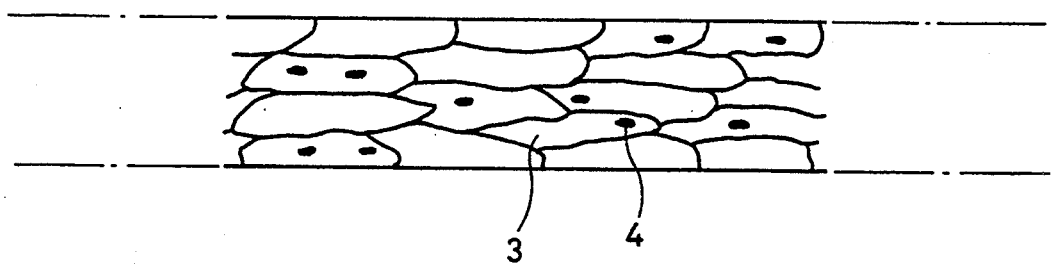
FIG. 2 is a longitudinal sectional view showing an annealed state of the crystals which are grown according to the inventive method.

Raw material bars having a composition of $Bi_2Sr_2Ca_1Cu_2O_x$ were employed to grow crystal fibers of 0.4 in diameter by a laser pedestal growth method, under conditions of temperature gradients and growth rates shown in Table 1. The as-grown crystals were annealed in an atmosphere under the atmospheric air (oxygen partial pressure: 0.2 atm.) with annealing conditions shown in Table 1. Mean particle diameters and volume percentages of Bi deficient phases contained in the annealed crystals were evaluated with a transmission electron microscope. Further, critical current densities were measured in liquid nitrogen, under conditions of zero magnetic fields and magnetic fields of 500 G which were applied perpendicularly to current carrying directions. Table 1 also shows the results.

TABLE 1

| | No. | Temperature Gradient (°C./cm) | Growth Rate (mm/h) | Annealing Condition | Mean Particle of Bi Deficient Phase | Volume Percentage of Bi Deficient Phase | Jc (A/cm², 0 G) | Jc (A/cm², 500 G) |
|---|---|---|---|---|---|---|---|---|
| Inventive Sample | 1 | 1000 | 150 | 840° C. × 90 h | 0.3 μm | 10% | 20,000 | 12,000 |
| | 2 | 2000 | 700 | 800° C. × 3 h | 0.1 μm | 15% | 25,000 | 15,000 |
| | 3 | 2500 | 1000 | 820° C. × 10 h | 0.01 μm | 12% | 50,000 | 30,000 |
| | 4 | 3000 | 2000 | 850° C. × 5 h | 0.02 μm | 18% | 40,000 | 30,000 |
| | 5 | 2000 | 1000 | 830° C. × 30 h | 0.005 μm | 20% | 60,000 | 40,000 |
| | 6 | 1500 | 500 | 840° C. × 80 h | 0.008 μm | 20% | 70,000 | 60,000 |
| Comparative | 7 | 1000 | 200 | 750° C. × 3 h | 20 μm | 10% | 500 | 0 |

TABLE 1-continued

| | No. | Temperature Gradient (°C./cm) | Growth Rate (mm/h) | Annealing Condition | Mean Particle of Bi Deficient Phase | Volume Percentage of Bi Deficient Phase | Jc (A/cm², 0 G) | Jc (A/cm², 500 G) |
|---|---|---|---|---|---|---|---|---|
| Sample | 8 | 1000 | 200 | 870° C. × 1 h | Multiphase Structure | | 0 | — |
| | 9 | 1000 | 5 | 840° C. × 200 h | 30 μm | 20% | 1,500 | 200 |
| | 10 | 1000 | 1200 | | | Ungrowable | | |

As clearly understood from Table 1, the samples Nos. 1 to 6 prepared according to the inventive method contained fine Bi deficient phases of small mean particle diameters, and exhibited high critical current densities in the magnetic fields of 500 G. On the other hand, the comparative sample No. 7, which was annealed at a lower temperature, contained Bi deficient phases of a large mean particle diameter, and exhibited a low critical current density. The comparative sample No. 8, which was annealed at a higher temperature, was in a multiphase structure, and revealed no superconductivity. The comparative sample No. 9, which had a low product G.R of 5000 below the inventive range, contained Bi deficient phases of a large mean particle diameter, and exhibited a small critical current density. In the comparative sample No. 10 having a ratio G/R of less than 1, it was impossible to attain crystal growth.

Example 2

A raw material bar having a composition of $Bi_2Sr_2Ca_1Cu_2O_x$ was employed to grow a crystal fiber of 0.5 mm in diameter by a laser pedestal growth method under conditions of a temperature gradient of 1500° C./cm and a growth rate of 300 mm/h. The as-obtained crystal fiber was annealed at 840° C. for 50 hours, and its longitudinal section was exposed by polishing, to linearly analyze growth-perpendicular components with an X-ray microanalyzer of 50 Å in beam diameter.

In portions of low-temperature superconducting phases, composition fluctuation was recognized in a cycle of 1 μM. The width of this fluctuation was between $Bi_2Sr_2Ca_{0.1}Cu_{1.2}O_x$ and $Bi_2Sr_2Ca_1Cu_2O_x$.

The portions of the low-temperature superconducting phases of the crystal fiber were oriented in the growth direction. The crystal fiber exhibited a critical current density of 30,000 A/cm² in a zero magnetic field in liquid nitrogen. When a magnetic field of 1000 G was applied perpendicularly to the current, the crystal fiber exhibited a critical current density of 18,000 A/cm².

The crystal fiber was observed with a transmission electron microscope, and it was confirmed that Bi deficient phases of 0.01 μm in mean particle diameter were finely dispersed in the low-temperature superconducting phase matrix with a volume percentage of 11%.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing a Bi—Sr—Ca—Cu—O superconductive material having an improved critical current density in a magnetic field, said method comprising the steps of:
   (a) orienting 0112 phases perpendicular to a growth direction by growing crystals using a laser pedestal growth method under conditions satisfying:

$G/R \geq 1$ and $G \times R \geq 10000$ where G (K/cm) represents the temperature gradient at a solid-liquid interface and R (mm/h) represents the rate of crystal growth; and
   (b) dispersing the 0112 phases as pinning centers in a 2212 phase matrix having compositional fluctuation by annealing the grown crystals for at least two hours in an atmosphere having oxygen partial pressure of at least 0.05 atm. within a temperature range of 800° to 860° C.

2. The method of claim 1, wherein said compositional fluctuation is in the range of $Bi_2Sr_2Ca_{0.1}Cu_{1.2}O_x$ to $Bi_2Sr_2Ca_1Cu_2O_x$.

* * * * *